United States Patent
Luan et al.

(10) Patent No.: US 11,538,690 B2
(45) Date of Patent: Dec. 27, 2022

(54) PLASMA ETCHING TECHNIQUES

(71) Applicant: Tokyo Electron Limited, Tokyo (JP)

(72) Inventors: Pingshan Luan, Albany, NY (US); Aelan Mosden, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/171,742

(22) Filed: Feb. 9, 2021

(65) Prior Publication Data
US 2022/0254645 A1  Aug. 11, 2022

(51) Int. Cl.
  *H01L 21/3065* (2006.01)
  *H01L 21/311* (2006.01)
  *H01L 21/3213* (2006.01)

(52) U.S. Cl.
  CPC .... *H01L 21/30655* (2013.01); *H01L 21/3065* (2013.01); *H01L 21/31116* (2013.01); *H01L 21/32135* (2013.01); *H01L 21/32136* (2013.01); *H01L 21/32137* (2013.01)

(58) Field of Classification Search
  None
  See application file for complete search history.

(56) References Cited

U.S. PATENT DOCUMENTS

| | | | |
|---|---|---|---|
| 2011/0003451 A1 | 1/2011 | Orlowski et al. | |
| 2015/0099368 A1 | 4/2015 | Shen et al. | |
| 2015/0126040 A1* | 5/2015 | Korolik | H01J 37/32357 438/718 |
| 2018/0053837 A1* | 2/2018 | Bi | H01L 29/0665 |
| 2020/0027741 A1* | 1/2020 | Kal | H01L 29/0673 |
| 2020/0098575 A1 | 3/2020 | Takahashi et al. | |
| 2020/0105539 A1 | 4/2020 | Takahashi et al. | |
| 2020/0266070 A1 | 8/2020 | Voronin et al. | |

OTHER PUBLICATIONS

E. Pargon et al., "New Route for Selective Etching in Remote Plasma Source: Application to the Fabrication of Horizontal Stacked Si Nanowires for Gate All Around Devices", (J. Vac. Sci. Technol. A. vol. 37, pp. 040601-1 to 040601-5. (Year: 2019).*

H. Xiao, Introduction to Semiconductor Manufacturing Technology, SPIE Press, ISBN 978-0-8194-9092-6, pp. 244-245. (Year: 2012).*

(Continued)

*Primary Examiner* — Jiong-Ping Lu
(74) *Attorney, Agent, or Firm* — Slater Matsil, LLP

(57) ABSTRACT

In certain embodiments, a method for processing a semiconductor substrate includes receiving a semiconductor substrate that includes a film stack. The film stack includes a first silicon layer, a second silicon layer, and a first germanium-containing layer positioned between the first silicon layer and the second silicon layer. The method further includes selectively etching the first germanium-containing layer by exposing the film stack to a plasma that includes fluorine agents, nitrogen agents, and hydrogen agents. The plasma etches the first germanium-containing layer and causes a passivation layer to be formed on exposed surfaces of the first silicon layer and the second silicon layer to inhibit etching of the first silicon layer and the second silicon layer during exposure of the film stack to the plasma.

24 Claims, 6 Drawing Sheets

(56) References Cited

OTHER PUBLICATIONS

Zhaslan Baraissov, et al.. "Selective Wet Etching of Silicon Germanium in Composite Vertical Nanowires." ACS Applied Materials & Interfaces, American Chemical Society, 2019. https://doi.org/10.1021/acsami.9b11934.

Li Junjie, et al. "A Novel Dry Selective Isotropic Atomic Layer Etching of SiGe for Manufacturing Vertical Nanowire Array with Diameter Less than 20 nm. Materials." 2020; 13(3):771. https://doi.org/10.3390/ma13030771.

International Searching Authority, "Notification of Transmittal of the International Search Report and the Written Opinion of the International Searching Authority, or the Declaration," "International Search Report," and "Written Opinion," International Application No. PCT/US2022/014996, dated May 20, 2022, 10 pages.

\* cited by examiner

PLASMA ETCHING TECHNIQUES

TECHNICAL FIELD

This disclosure relates generally to semiconductor fabrication, and, in certain embodiments, to plasma etching techniques.

BACKGROUND

The integrated circuit (IC) manufacturing industry strives to increase device density to improve speed, performance, and costs. For continued scaling to smaller node sizes, device architectures have evolved from two-dimensional (2D) planar structures to three-dimensional (3D) vertical structures, such as with nanowires or vertically oriented transistors. Insufficient control of the conducting channel by the gate potential drives a desire for this change. Short channel effects (SCE) may become too significant as gate dimensions are scaled down and may increase current conduction when no voltage is applied to the gate ($I_{off}$). A change in device architecture may allow better electrostatic control of the gate to reduce the SCE and power loss. Fabricating nanowire devices may present 3D etch challenges where highly selective isotropic etch processes are beneficial. For example, layers of exposed materials may need to be etched relative to one another to create indents in a film stack.

SUMMARY

In certain embodiments, a method for processing a semiconductor substrate includes receiving a semiconductor substrate that includes a film stack. The film stack includes a first silicon layer, a second silicon layer, and a first germanium-containing layer positioned between the first silicon layer and the second silicon layer. The method further includes selectively etching the first germanium-containing layer by exposing the film stack to a plasma that includes fluorine agents, nitrogen agents, and hydrogen agents. The plasma etches the first germanium-containing layer and causes a passivation layer to be formed on exposed surfaces of the first silicon layer and the second silicon layer to inhibit etching of the first silicon layer and the second silicon layer during exposure of the film stack to the plasma.

In certain embodiments, a method for processing a semiconductor substrate includes positioning a semiconductor substrate in a plasma chamber of a plasma tool. The semiconductor substrate includes a film stack that has silicon layers and germanium-containing layers in an alternating stacked arrangement, with at least two silicon layers and at least two germanium-containing layers. The method further includes generating, in the plasma chamber of the plasma tool, a plasma that includes fluorine agents, nitrogen agents, and hydrogen agents. The plasma is generated from gases that include a fluorine-containing gas, a nitrogen-containing gas, a hydrogen-containing gas, and a noble gas. The method further includes exposing, in the plasma chamber of the plasma tool, the film stack to the plasma. The plasma causes a nitride passivation layer to be formed on exposed surfaces of the silicon layers and selectively etches opposing exposed ends of the germanium-containing layers to form indents in the germanium-containing layers relative to opposing exposed ends of the silicon layers. The nitride passivation layer inhibits etching of the silicon layers by the plasma.

In certain embodiments, a method for processing a semiconductor substrate includes positioning a semiconductor substrate in a plasma chamber of a plasma tool. The semiconductor substrate includes a film stack that has first layers of a first material and second layers of a second material in an alternating stacked arrangement. The first material is a germanium-containing material that includes germanium at a concentration of about ten to about fifty percent. The method further includes generating a plasma for selectively etching the first layers of the first material. Generating the plasma includes introducing gases containing fluorine, nitrogen, hydrogen, and a noble gas into the plasma chamber and maintaining a pressure in the plasma chamber of less than about 50 millitorr. The method further includes exposing, in the plasma chamber, the film stack to the plasma for a time period. The plasma selectively etches opposing exposed ends of the first layers of the first material to form indents in the first layers of the first material relative to opposing exposed ends of the second layers of the second material.

BRIEF DESCRIPTION OF THE DRAWINGS

For a more complete understanding of this disclosure, and advantages thereof, reference is made to the following descriptions taken in conjunction with the accompanying drawings, in which.

DETAILED DESCRIPTION OF ILLUSTRATIVE EMBODIMENTS

Figure 1A:
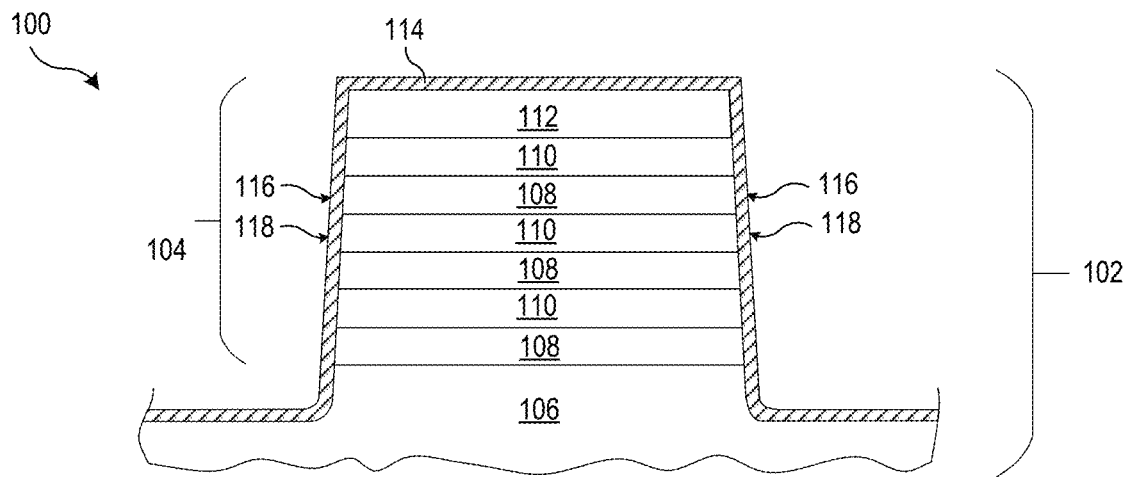
FIGS. 1A-1D illustrate cross-sectional views of an example semiconductor substrate during an example process for processing the semiconductor substrate, according to certain embodiments of this disclosure.

Various techniques for attempting to selectively etch one material relative to another exist. In some cases the chemistry of two materials is sufficiently distinct to allow a plasma that is selective to etching one of the materials to be used without concern for etching the other material. In other cases determining appropriate etching regimes for selective etching is more difficult because the chemistry of the materials may be similar or the available etching processes may be limited by other factors. Certain materials present more difficult selectivity challenges where it is desirable to etch one material with little to no etching of another material. Conventional processes for this type of selective etching may be unable to achieve selective etching of one material relative to another or may fall short of process requirements such as selectivity, etch profile (e.g., local uniformity and/or surface roughness), and others.

Selectivity challenges may arise in forming nanowires or nanosheets to act as a channel region in a 3D vertical structure of a semiconductor device, such as a gate-all-around (GAA) device. Forming such nanowires may involve forming a film stack on a base layer, the film stack including layers of Si and Ge or Si—Ge (SiGe) alloy arranged in an alternating stack. Part of this process may include etching indents in the film stack at opposing ends of the Ge or Ge-containing layers, while minimizing etching of the silicon (Si) layers, to expose end portions of the Si layers for later use as a conducting device. Due to various challenges, including in part a native oxide layer (NOL) and/or other residues (e.g., reactive ion etching (RIE) residue) present on surfaces of the film stack, conventional etching techniques may be unsatisfactory.

Etching Ge-containing layers while also minimizing etching of the Si layers may be particularly challenging when the Ge-containing layers include a relatively low concentration of Ge, such as less than or equal to about 30% Ge and, in a particular example, less than or equal to about 15%. This challenge may be due, at least in part, to the chemical make-up of the Ge-containing layers (e.g., SiGe layers) and to the Si layers becoming more similar when Ge-containing layers having lower concentrations of Ge are used.

Prior to performing the plasma etch to form indents in the film stack, some conventional techniques use a wet or dry process to remove the NOL. The film stack may be processed using a dilute hydrogen-fluoride (HF) acid or a chemical oxide removal process with the formation of ammonium fluorosilicate. Removing the NOL over surfaces of both the Si layers and the Ge-containing layers, however, may reduce the selectivity of the subsequent indent plasma etch process (e.g., using a conventional fluorine-based etch process, as described below) to etch the Ge-containing layers with minimal to no etching of the Si layers.

Some conventional techniques expose surfaces of both the Si layers and the Ge-containing layers (e.g., along the sidewalls of the film stack) to fluorine-containing chemicals (e.g., fluorine ($F_2$), chlorine trifluoride ($ClF_3$), bromine trifluoride ($BrF_3$), or iodine pentafluoride ($IF_5$)) or to fluorine-containing radicals generated by plasma. Such conventional plasmas may be generated from gases including carbon tetrafluoride ($CF_4$) and argon (Ar) or from gases including nitrogen trifluoride ($NF_3$) and nitrogen ($N_2$). The fluorine-containing etchants (whether in the fluorine-containing chemicals or fluorine radicals in a plasma) may react more quickly with the Ge-containing layers than the Si layers, which may achieve some level of selectivity to Si (etching the Ge-containing layers faster than the Si layers). While the Si layers are less reactive to the fluorine-containing etchants associated with these conventional techniques, an undesirable amount of etching of the Si layers still occurs. For example, the etching of the Si layers can result in corner rounding if the etching of the Si layers occurs at the corners of the Si layers. Additionally, at relatively low concentrations of Ge in the Ge-containing layers (e.g., s about 30%, and about 15% in a particular example), the difference in reactivity of the Si layers and the Ge-containing layers to the fluorine-containing etchants may be significantly reduced, which may lead to poor selectivity (e.g., less than about 20:1 (etch rate of the Ge-containing layers to the etch rate of the Si layers) for 15% Ge in a particular example).

Embodiments described below provide various techniques of selective etching. For example, embodiments may be used to selectively etch portions of a film stack (e.g., that includes Si layers and Ge-containing layers in an alternating stacked arrangement) of a substrate. It may be desirable to selectively etch indents in edge portions of (or possibly completely remove) the Ge-containing layers to form the contact handles for Si nanowire layers and may provide improved selectivity to Si layers even at low concentrations of Ge in the Ge-containing layers (e.g., less than about 50% Ge, less than about 30% Ge, less than about 25% Ge, and in particular embodiments less than about 15% Ge).

Certain embodiments use plasma to form indented regions, or recesses, in a film stack that includes Si layers and Ge-containing layers in an alternating stacked arrangement. The plasma may be generated from gases that include a fluorine-containing gas, a hydrogen-containing gas, and a carrier gas (e.g. noble gases such as Ar and He), and the plasma may include fluorine agents, hydrogen agents, and nitrogen agents. The plasma may cause a passivation layer (e.g., a nitride passivation layer, such as a Si nitride passivation layer) to be formed on exposed surfaces of the Si layers, which may serve as an etch stop layer on exposed surfaces of the Si layers while the etchant in the plasma (e.g., fluorine agents) etches the Ge-containing layers. Prior to exposing the substrate to the plasma, a barrier layer (e.g., an NOL) may be substantially removed from exposed surfaces of the film stack using a suitable dry or wet etch process.

FIGS. 1A-1D illustrate cross-sectional views of an example substrate 102 during an example process 100 for processing substrate 102, according to certain embodiments of this disclosure. In certain embodiments, process 100 includes using a plasma suitable for etching portions of certain layers (e.g., Ge-containing layers) of a film stack of substrate 102 while forming a protective passivation layer on exposed portions of other layers (e.g., Si layers) of the film stack, resulting in substrate 102 having an indented film stack following execution of process 100.

As illustrated in FIG. 1A, substrate 102 is a semiconductor substrate that includes film stack 104 disposed on a base layer 106. Film stack 104 includes Ge-containing layers 108 and Si layers 110 in an alternating stacked arrangement. Film stack 104 may have any suitable shape and include any suitable number of layers. As examples, the vertical thickness of individual Ge-containing layers 108 and Si layers 110 may be about 5 nm to about 25 nm each, and as particular examples may be about 10 nm or about 20 nm. Additionally, Ge-containing layers 108 may have the same thicknesses or may vary in thickness relative to one another, Si layers 110 may have the same thickness or may vary in thickness relative to one another, and Ge-containing layers 108 and Si layers 110 may have the same thicknesses or may vary in thickness relative to one another. In a particular example, Ge-containing layers 108 and Si layers 110 all have substantially the same thicknesses.

The material of Ge-containing layers 108 may be pure Ge or SiGe alloy, for example. As a particular example, the Ge-containing layers 108 may include a SiGe alloy (mixture) in an appropriate ratio (e.g., $Si_{0.7}Ge_{0.3}$, $Si_{0.85}Ge_{0.15}$, etc.) for desired etching properties of a given application or for desired performance in a resulting semiconductor device formed using, in part, process 100. Although this disclosure contemplates Ge-containing layers 108 including any suitable concentration of Ge (including 100% Ge) relative to another material (e.g., Si), in certain embodiments Ge-containing layers 108 including less than or equal to about 50% Ge, less than or equal to about 30% Ge, less than or equal to about 25% Ge, less than or equal to about 15% Ge, or less than or equal to about 10% Ge. As just one particular example range, Ge-containing layers 108 may include about 10% to about 50% Ge relative to another one or more materials (e.g., Si). In certain embodiments, all Ge-containing layers 108 include the same materials; however, Ge-containing layers 108 may include different materials if desired.

The material of Si layers 110 may be pure Si, for example. In certain embodiments, all Si layers 110 include the same material; however, Si layers 110 may include different materials if desired. Although in this particular example Si layers 110 are primarily described as being pure Si, it should be understood that in certain embodiments, the material selective to which Ge-containing layers (e.g., Ge-containing layers 108) are being etched may include another suitable material such as Si nitride (SiN).

Base layer 106 may be any suitable material and is or includes Si in one example. In a particular example, film stack 104 is formed by growing alternating heteroepitaxial layers of Ge or SiGe (e.g., Ge-containing layers 108) and Si (e.g., Si layers 110) atop base layer 106.

An optional hard mask 112 may be included on top of film stack 104. Hard mask 112 may have been used to form the structure of film stack 104, in a previous etch process for example. In certain embodiments, hard mask 112 is SiN (e.g., Si nitride ($Si_3N_4$)) but may include any suitable material.

A barrier layer 114 is formed over film stack 104 (including hard mask 112) and, in this example, base layer 106. Barrier layer 114 may result from prior fabrication steps (e.g., RIE) applied to substrate 102 or from other handling of substrate 102 (e.g., exposure to ambient air when transferring between processing tools). As particular examples, barrier layer 114 may include an NOL, RIE residue, or both. An NOL may be a thin layer of $SiO_2$ (or other suitable material), about 1.0 nm to about 2.0 nm thick for example, that forms on surfaces of substrate 102, such as when substrate 102 is exposed to ambient air, which contains $O_2$ and $H_2O$. For example, surfaces of base layer 106, Ge-containing layers 108, Si layers 110, and hard mask 112 may interact with the ambient air, which may result in barrier layer 114 at those surfaces. As another example, surfaces of base layer 106, Ge-containing layers 108, Si layers 110, and hard mask 112 may include a residue resulting from prior RIE steps.

Barrier layer 114 may have different etch properties than layers that underlie barrier layer 114. Although shown as having generally uniform coverage over film stack 104 (including hard mask 112) and base layer 106, barrier layer 114 might or might not have uniform coverage.

Each of the layers in film stack 104 has a pair of exposed surfaces at opposed ends when viewed, as illustrated, from a cross-sectional perspective. That is, each of Ge-containing layers 108 has (opposing) exposed surfaces 116, and each of Si layers 110 has (opposing) exposed surfaces 118. Additionally, in the state illustrated in FIG. 1A, because substrate 102 includes barrier layer 114, exposed surfaces of 116 of Ge-containing layers 108 and exposed surfaces 118 of Si layers 110 include barrier layer 114.

Figure 1B:
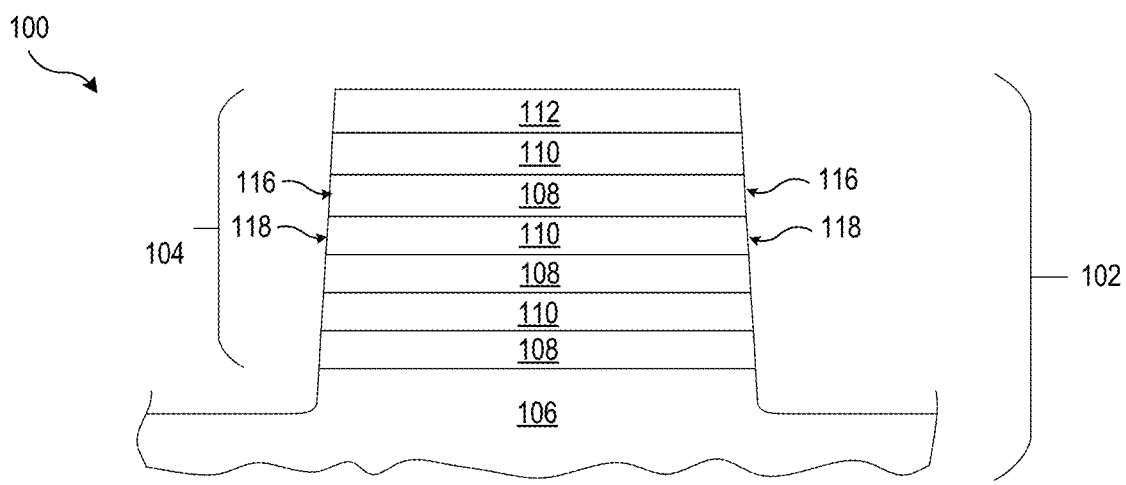

As illustrated in FIG. 1B, barrier layer 114 is etched to remove some or all of barrier layer 114 from exposed surfaces 116 of Ge-containing layers 108, from exposed surfaces 118 of Si layers 110, and from exposed surfaces of base layer 106 and hard mask 112. Barrier layer 114 may be removed using any suitable process, including any suitable wet etch or dry etch process. In certain embodiments, substrate 102 is processed using a dilute HF acid or a chemical oxide removal process to remove some or all of barrier layer 114. The process used to etch barrier layer 114 might or might not remove some or all of hard mask 112, but for purposes of this example, hard mask 112 is shown not to be removed or otherwise etched. Removing barrier layer 114 from exposed surfaces 116 of Ge-containing layers 108 and from exposed surfaces 118 of Si layers 110, however, may reduce the selectivity of a subsequent conventional fluorine-based indent plasma etch process to attempt to etch Ge-containing layers 108 with minimal to no etching of Si layers 110.

Figure 1C:
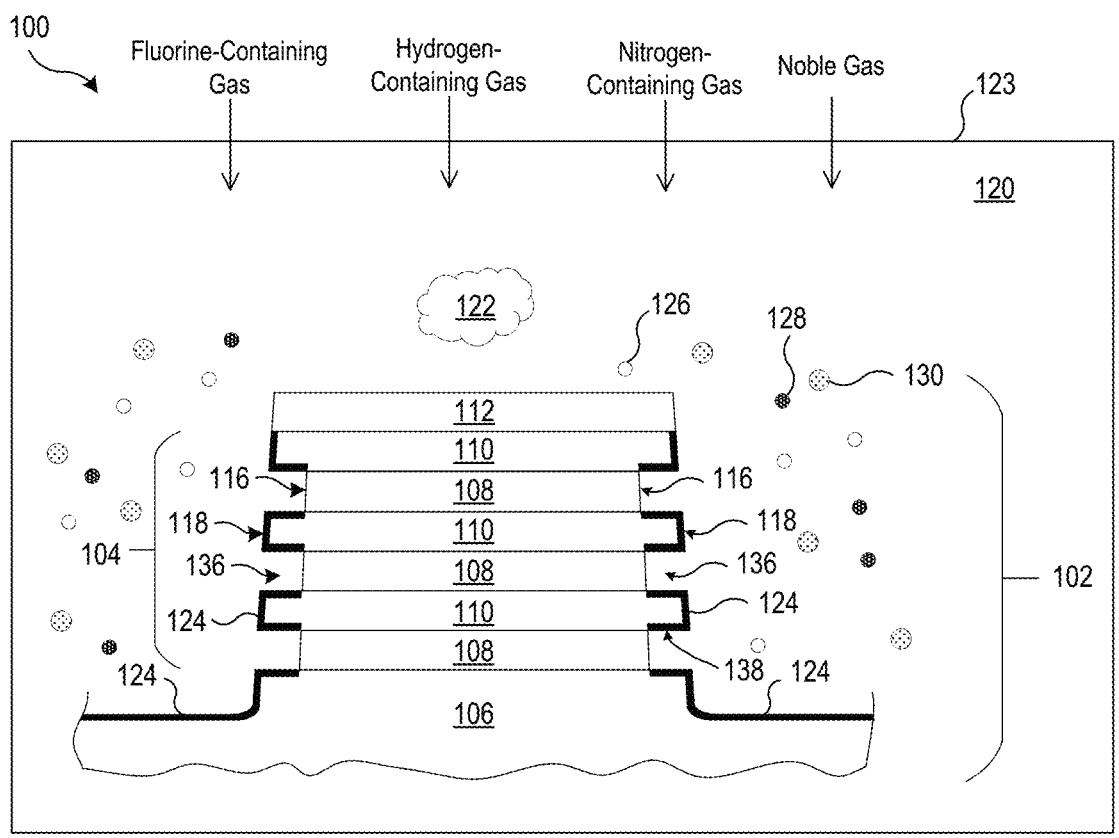

As illustrated in FIG. 1C, in a plasma step 120 of process 100, substrate 102 is exposed to plasma 122 to selectively etch Ge-containing layers 108. For example, substrate 102 may be exposed to plasma 122 to selectively etch exposed surfaces 116 of Ge-containing layers 108 to form indents 136 in film stack 104, with opposing end portions of Ge-containing layers 108 in an intermediate state of removal/etching relative to adjacent Si layers 110. In certain embodiments, plasma step 120 is an isotropic etch process.

Plasma step 120 may be performed in plasma chamber 123 of a plasma tool. The plasma tool may be any suitable type of plasma tool, including an inductively-coupled plasma (ICP) tool, a capacitively-coupled plasma (CCP) tool, a surface wave plasma (SWP) tool, and others. One example plasma tool is described below with reference to FIG. 5.

During exposure of substrate 102 to plasma 122 and to facilitate selective etching of Ge-containing layers 108, plasma 122 may cause a passivation layer 124 to be formed on exposed surfaces 118 of Si layers 110. Plasma 122 may cause passivation layer 124 to form on exposed surfaces 118 of Si layers 110 by removing and replacing or otherwise modifying portions of Si layers 110 at exposed surfaces 118 of Si layers 110. In certain embodiments, passivation layer 124 also may be formed on exposed surfaces of base layer 106, such as when base layer 106 is pure Si or is Si nitride.

During exposure of substrate 102 to plasma 122, passivation layer 124 on exposed surfaces 118 of Si layers 110 (and, in the illustrated example, on exposed surfaces of base layer 106) inhibits etching of Si layers 110 (and, in the illustrated example, of base layer 106). In other words, plasma 122 selectively etches Ge-containing layers 108 due at least in part to the formation and presence of passivation layer 124 on exposed surfaces 118 of Si layers 110 (and on exposed surfaces of base layer 106), passivation layer 124 acting as an etch stop layer on exposed surfaces 118 of Si layers 110 (and on exposed surfaces of base layer 106). In certain embodiments, passivation layer 124 inhibiting etching of Si layers 110 (and, in the illustrated example, of base layer 106) includes passivation layer 124 preventing etching of some or all of Si layers 110, reducing etching of some or all of Si layers 110, slowing down etching of some or all of Si layers 110, or the like.

Although passivation layer 124 may have any suitable thickness, in certain embodiments, passivation layer 124 is relatively thin, such as 2 nm or less. Passivation layer 124 could be, for example, a monolayer. In certain embodiments, passivation layer 124 is a nitride, such as Si nitride (e.g., $Si_3N_4$).

As plasma 122 etches Ge-containing layers 108, additional surfaces 138 of Si layers 110 are exposed. That is, as indents 136, or recesses, are formed in film stack 104 due to the selective etching of Ge-containing layers 108, additional surfaces 138 of Si layers 110 are exposed. Plasma 122 may continue to form passivation layer 124 on additional surfaces 138. Passivation layer 124 formed on additional surfaces 138 also may be a nitride, such as Si nitride (e.g., $Si_3N_4$). In other words, passivation layer 124 is further formed over newly exposed surfaces (e.g., additional surfaces 138) of Si layers 110 as Ge-containing layers 108 are etched above, below, and/or between Si layers 110. Passivation layer 124 on additional surfaces 138 inhibits etching of Si layers 110 at additional surfaces 138, while passivation layer 124 at exposed surfaces 118 of Si layers 110 inhibits etching of Si layers 110 at exposed surfaces 118.

Plasma 122 may include fluorine agents 126, hydrogen agents 128, and nitrogen agents 130. Fluorine agents 126 may act primarily as the etchant for etching Ge-containing layers 108 at exposed surfaces 116 of Ge-containing layers 108. Hydrogen agents 128 may act as a reducing agent, facilitating the etching of Ge-containing layers 108 at exposed surfaces 116 of Ge-containing layers 108 in the presence of fluorine agents 126. Furthermore, if applicable depending on the gases used to generate plasma 122, hydrogen agents 128 may further break down certain compounds of fluorine and nitrogen to produce fluorine agents 126 and nitrogen agents 130, and to promote formation of passivation layer 124 (e.g., nitrides, such as Si nitride) on surfaces 118 of Si layers 110 and/or etching of Ge-containing layers 108. Nitrogen agents 130 react with the Si at exposed surfaces 118 of Si layers 110 to form a nitride layer (e.g., a Si nitride layer, such as $Si_3N_4$) at exposed surfaces 118. For example, the atomic nitrogen (N) generated in plasma 122 may react with the Si molecules at exposed surfaces 118 of Si layers 110 (and exposed surfaces of base layer 106) to form passivation layer 124 (e.g., a nitride layer) on exposed surfaces 118 of Si layers 110 (and on exposed surfaces of base layer 106).

Although fluorine agents 126, hydrogen agents 128, and nitrogen agents 130 are primarily illustrated and described as separate elements, this disclosure contemplates fluorine agents 126, hydrogen agents 128, and nitrogen agents 130 being separate or some or all of fluorine agents 126, hydrogen agents 128, and nitrogen agents 130 being part of one or more compounds within plasma 122. For example, plasma 122 may include one or more of NH species, HF species, NF species, or other suitable species. It will be understood that references throughout this disclosure to fluorine agents 126, hydrogen agents 128, and nitrogen agents 130 contemplates these agents as separate elements and these agents as part of one or more compounds of plasma 122.

In certain embodiments, plasma 122 may be generated from gases that include fluorine-containing gas, hydrogen-containing gas, nitrogen-containing gas, and a noble gas. The fluorine-containing gas may act as an etchant, the hydrogen-containing gas may act as a reductive gas, and the noble gas may act as a carrier gas. As a few examples, a fluorine-containing gas that is used to generate plasma 122 may include $NF_3$, sulfur hexafluoride ($SF_6$), or carbon tetrafluoride ($CF_4$). In certain embodiments, such as some examples in which a fluorine-containing gas that does not include nitrogen is used (or even in some examples in which a fluorine-containing gas that does include nitrogen is used), it may be appropriate to provide nitrogen gas in another suitable way, such as by introducing ammonia ($NH_3$), which also might be used as the hydrogen-containing gas as described below, or nitrogen gas ($N_2$). Regarding the hydrogen-containing gas, as a few examples, a hydrogen-containing gas that is used to generate plasma 122 may include $H_2$ or ammonia ($NH_3$). As described above, the hydrogen gas may promote formation of passivation layer 124 (e.g., nitrides, such as Si nitride) on surfaces 118 of Si layers 110 and/or etching of Ge-containing layers 108.

Although illustrated separately, the nitrogen-containing gas might be provided separately (e.g., as nitrogen gas ($N_2$)) and/or as part of a compound with one or more of the other gases used to generate plasma 122 (e.g., as part of a compound with the fluorine-containing gas and/or as part of a compound with the hydrogen-containing gas). For example, a nitrogen carrier gas ($N_2$) may be added and/or the nitrogen agents 130 for forming passivation layer 124 (e.g., in embodiments in which passivation layer 124 is a nitride layer) may be provided from other gases, such as a nitrogen-containing compound for the fluorine-containing gas or a nitrogen-containing compound for the hydrogen-containing gas. In other words, the source of nitrogen agents 130 in plasma 122 may be an etchant gas (e.g., a fluorine-containing gas) that includes nitrogen (e.g., $NF_3$), a reductive gas (e.g., a hydrogen-containing gas) that includes nitrogen (e.g., $NH_3$), a carrier gas that includes nitrogen (e.g., an $N_2$ carrier gas), or another suitable nitrogen-containing source gas, and nitrogen agents 130 may be atomic nitrogen disassociated from the source gas.

As a particular example, the gases used to generate plasma 122 may include a suitable combination of $NF_3$, Ar, and $H_2$. In certain embodiments, the Ar could be replaced by another noble gas, such as helium (He) or krypton (Kr). As particular examples, gases/gas combinations used to generate plasma 122 may include $NF_3/NH_3/Ar$, $NF_3/NH_3/N_2/Ar$, $NF_3/H_2/Ar$, or $NF_3/H_2/Ar/N_2$.

Various process parameters for plasma step 120 may be optimized to promote formation of fluorine agents 126 for effective etching of Ge-containing layers 108 while generating sufficient hydrogen agents 128 and nitrogen agents 130 for forming passivation layer 124 (e.g., a nitride passivation layer, such as Si nitride) at exposed surfaces 118 and additional surfaces 138 of Si layers 110. In an example in which the gases used to generate plasma 122 include $NF_3$ and $H_2$, the ratio of $NF_3$ to $H_2$ may be an appropriate consideration. The ratio of one gas to another may be measured in terms of respective flow rates, such as standard cubic centimeters per minute (sccm). In certain embodiments, plasma 122 includes more fluorine agents 126 than hydrogen agents 128 to ensure that Ge-containing layers 108 are still etched and that a passivation layer similar to passivation layer 124 is unlikely to form on exposed surfaces 116 of Ge-containing layers 108 (particularly at low concentrations of Ge in Ge-containing layers 108), but also includes sufficient nitrogen agents 130 and hydrogen agents 128 to facilitate formation of passivation layer 124 sufficiently quickly to reduce or eliminate etching of Si layers 110 by the generally more reactive fluorine agents 126.

The appropriate ratio (or range of ratios) may depend on a variety of factors, including other process parameters and the concentration of Ge in Si layers 110. Hydrogen gas ($H_2$) may help drive the reactions occurring in plasma chamber 123, including etching of Ge-containing layers 108 and formation of passivation layer 124 on exposed surfaces 118 and additional surfaces 138 of Si layers 110. Example ranges for the ratio of $NF_3$ to $H_2$ may include from $NF_3:H_2$=about 4:about 1 to $NF_3:H_2$=about 10:about 1, and may be $NF_3:H_2$=about 5:about 1 in a particular example. In certain embodiments, when the $H_2$ low is higher than about 30 sccm and the concentration of Ge in Ge-containing layers 108 is less than or equal to about 15%, then the etch rate of Ge-containing layers 108 by fluorine agents 126 may be reduced. It should be understood that this may or may not be the case for certain implementations, as the particular etch rates can depend on a variety of factors. Regarding the noble gas, example ranges for the ratio of $NF_3$ to Ar may include from $NF_3:Ar$=about 1:about 2.5 to $NF_3:Ar$=about 1:about 10.

Other process parameters for generating plasma 122 include gas flow rates, pressure, plasma source power, plasma bias power, time, and temperature. The gases for forming plasma 122 may be provided at any suitable flow rate. In certain embodiments, the etchant source gas flow rate is fluorine-containing gas (e.g., $NF_3$)=20-80 sccm (and 50 sccm in a particular example), $H_2$=5-15 sccm (and 10 sccm in a particular example), Ar=500-1500 sccm (and 1000 sccm in a particular example). In these examples, the flow rate of the fluorine-containing gas is relatively moderate, the flow rate of the hydrogen-containing gas is relatively low, and the flow rate of the noble gas is relatively high.

In certain embodiments, plasma step 120 may be performed at relatively low pressure (e.g., less than about 100 mTorr, less than about 50 mTorr, and in one example about 15 mTorr to about 25 mTorr) and at relatively low source power (e.g., less than about 400 W, less than about 100 W, and in one example a high frequency source power of about 100 W and a low frequency bias power of about 0 W). Exposure time for plasma step 120 may be any suitable time. In certain embodiments, exposure time could be as little as about five seconds or less, fifteen seconds or less, twenty-five seconds or less, thirty seconds or less, or 45 second or less. The appropriate exposure time may depend on other parameters such that the optimum combination of parameters is determined to achieve the desired level of selectivity (or other appropriate goals). In certain embodiments, plasma step 120 is performed at a temperature of approximately −40° C. to approximately 20° C., and in one example at about ° C.

One example recipe for plasma step 120 includes the following: pressure about 15 to about 25 mTorr; source power (inductively coupled plasma) 100 W; bias power 0 W; wafer processing temperature 0° C.; and $NF_3$, $H_2$, and Ar flow rates of 50 sccm, 10 sccm, and 1000 sccm, respectively.

It should be understood that as to all parameters described herein, particular values and ranges are provided for example purposes only.

In certain embodiments, plasma step 120 is an oxygen-free plasma etch step to etch portions of certain layers of a film stack of substrate 102, resulting in substrate 102 having an indented, or recessed, film stack following execution of process 100. It should be understood that oxygen-free does not necessarily mean that all oxygen is eliminated from plasma step 120, but instead reflects that oxygen-containing gas is not deliberately introduced as part of plasma step 120. Removing all oxygen from a plasma chamber 123 may be difficult or impossible, so some oxygen may still be present in plasma chamber 123 during plasma step 120.

Figure 1D:
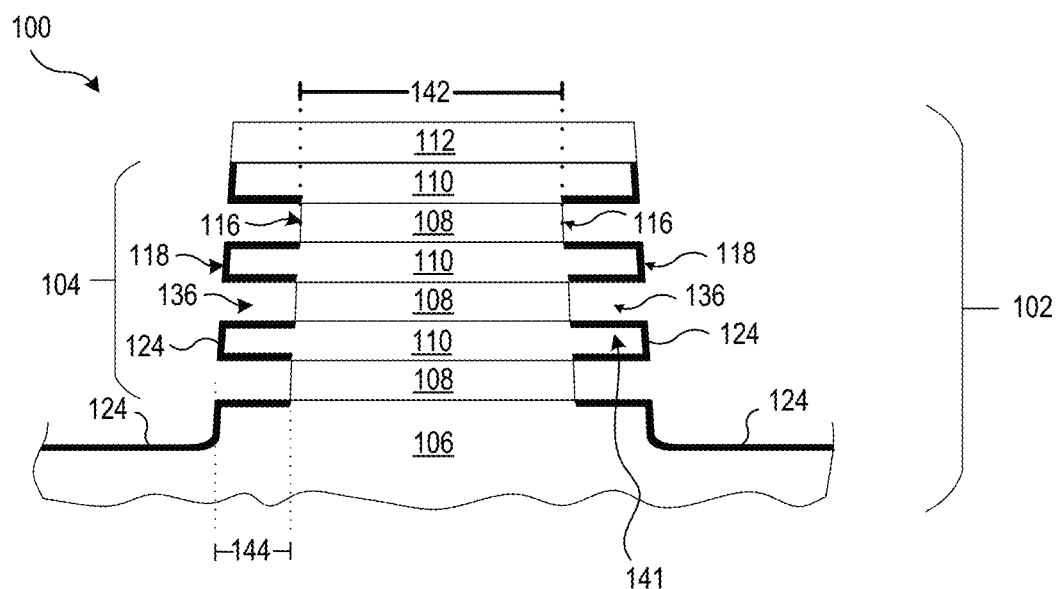

FIG. 1D illustrates substrate 102 following plasma step 120. In the state illustrated in FIG. 1D, film stack 104 includes indents 136 (of which two examples are labeled). Furthermore, due to the formation of indents 136, exposed ends 141 (of which one example is labeled) of Si layers 110 may be formed.

FIG. 1D shows certain measurements of resulting substrate 102, such as exposed end separation 142 and etched width 144. For example, exposed end separation 142 shows the remaining width (per this cross-section) of Ge-containing layers 108 by measuring each Ge-containing layer 108 from a first exposed surface 116 on a first side of film stack 104 to an opposing second exposed surface 116 on a second side of film stack 104. Exposed end separation 142 may be less than about 20 nm in certain embodiments, and between about 2 nm and about 20 nm in one embodiment. The exposed end separation may also refer to the separation of exposed ends prior to etching. Etched width 144 may measure how much of a particular Ge-containing layer 108 was removed from a particular end of the particular Ge-containing layer 108. In other words, etched width 144 may measure the amount of an indent 136 of a Ge-containing layer 108. In certain embodiments, etched width 144 is about 5 nm to about 50 nm. However, exposed end separation 142 and etched width 144 may be outside these ranges depending on a given application.

Subsequent processing may then be performed on substrate 102. For example, plasma step 120 may be integrated into a process for forming Si layers 110 into respective nanowires for a channel region of a semiconductor device, such as a GAA or other 3D device. In such a device, subsequent processing may include filling the indents 136 with an insulator, removing remaining portions of Ge-containing layers 108, providing a gate oxide around Si layers 110, and other associated steps, all of which are provided for example purposes only. In such a device, exposed ends 141 of Si layers 110 may serve as conductive contacts to a channel region formed in the area of film stack 104.

Process 100 may provide one or more technical advantages. Some conventional techniques for attempting to etch Ge-containing layers 108 selective to Si layers 110 expose surfaces of both Si layers 110 (e.g., exposed surfaces 118 and additional surfaces 138) and Ge-containing layers 108 (e.g., exposed surfaces 116) (e.g., along the sidewalls of film stack 104) to fluorine-containing chemicals (e.g., $F_2$, $ClF_3$, $BrF_3$, or $IF_5$) or fluorine-containing radicals generated by plasma. Such conventional plasmas, for example, may be generated from gases including $CF_4$ and Ar or from gases including $NF_3$ and $N_2$. The fluorine-containing etchants (whether in the fluorine-containing chemicals or fluorine radicals in a plasma) may react more quickly with Ge-containing layers 108 than Si layers 110, which may achieve some level of selectivity to Si (etching Ge-containing layers 108 faster than Si layers 110); however, an undesirable amount of etching of Si layers 110 still occurs.

For example, the etching of Si layers 110 can result in corner rounding if the etching of Si layers 110 occurs at the corners of Si layers 110. Additionally, a vertical thickness of Si layers 110 may be reduced by an undesirable amount, particular toward exposed surfaces 118, which are exposed to the etchant for the longest amount of time as exposed surfaces 116 of Ge-containing layers 108 are etched inward to form indents 136. Furthermore, at relatively low concentrations of Ge in Ge-containing layers 108 (e.g., ≤about 30%, and ≤about 15% in a particular example), the difference in reactivity of Si layers 110 and Ge-containing layers 108 to the fluorine-containing etchants may be significantly reduced, which may lead to poor selectivity (e.g., less than about 20:1 (etch rate of the Ge-containing layers to the etch rate of the Si layers)).

Additionally, conventional fluorine-based plasmas may etch other materials on a semiconductor substrate, such as Si dioxide ($SiO_2$), Si nitride ($Si_3N_4$), oxides, and low-k dielectric materials, which may be undesirable. In other words, such conventional fluorine-based plasmas are not selective to $SiO_2$, $Si_3N_4$, oxides, and low-k dielectric materials (e.g., Si oxycarbonitride (SiOCN), Si boron carbonitride (SiBCN), etc.).

According to embodiments of process 100, plasma step 120 may include forming passivation layer 124 (e.g., a nitride such as Si nitride) on Si layers 110. Passivation layer 124 inhibits etching of Si layers 110 (e.g., exposed surfaces 118 and additional surfaces 138) while the etchant of plasma 122 (e.g., fluorine agents 126) etch Ge-containing layers 108 to form indents 136 in film stack 104. In certain embodiments, despite a potentially low concentration of Ge in Ge-containing layers 108 (e.g., less than about 50%, less than about 30%, less than about 25%, and less than about 15% in a particular example), and depending in part on the concentration of Ge in Ge-containing layers 108, the selectivity (as measured by respective etch rates) of Ge-containing layers 108 to the Si layers 110 is greater than or equal to about 50 to about 1, greater than or equal to about 70 to about 1, or greater than or equal to about 100 to about 1. It should be understood that the respective etch rates can be determined in any suitable manner.

Additionally, due at least in part to the high-selectivity of plasma 122 to Si layers 110, which itself may be due at least in part to rapid formation of passivation layer 124 on exposed surfaces 118 and additional surfaces 138 of Si layers 110, film stack 104 may have an improved etch profile. The improved etch profile may include reduced surface roughness along surfaces 116 of Ge-containing layers 108 (to the extent Ge-containing layers 108 are not completely removed) and, in particular, along exposed surfaces 118 and remaining surfaces 138 of Si layers 110 following plasma step 120. Additionally or alternatively, the improved etch profile may include improved sharpness edges and a relatively square-shaped profile of exposed ends 141 of Si layers 110 following plasma step 120 as compared to what was possible with conventional techniques. In certain embodiments, plasma step 120, including the use of plasma 122 provides a relatively straight etch front along surfaces 116 of Ge-containing layers 108 (to the extent Ge-containing layers 108 are not completely removed) and good local uniformity regarding the amount of material removed from each Ge-containing layer 108 of film stack 104.

The nitride (e.g., Si nitride) passivation layer 124 may be insoluble in water, allowing passivation layer 124 to act as an $O_2$ and $H_2O$ diffusion barrier and thereby improve the stability of the nanowire formed from the Si layer 110. In addition to being selective to Ge and SiGe, plasma 122 (e.g., a fluorine-, hydrogen- and nitrogen-containing plasma) also may be selective to $SiO_2$, $Si_3N_4$, oxides, and low-k dielectric materials (e.g., SiOCN, SiBCN, etc.) due to the absence, in certain embodiments, of oxygen in the chemistry which is typically present for removing carbon and nitrogen bonds in these compounds (e.g., $SiO_2$, $Si_3N_4$, oxides, and low-k dielectric materials (e.g., SiOCN, SiBCN, etc.).

Furthermore, certain embodiments may provide improved structures that can be used in 3D devices such as may be suitable for GAA devices, 3D NAND or other memory devices, logic devices, or any other suitable type of semiconductor device.

Figure 2:
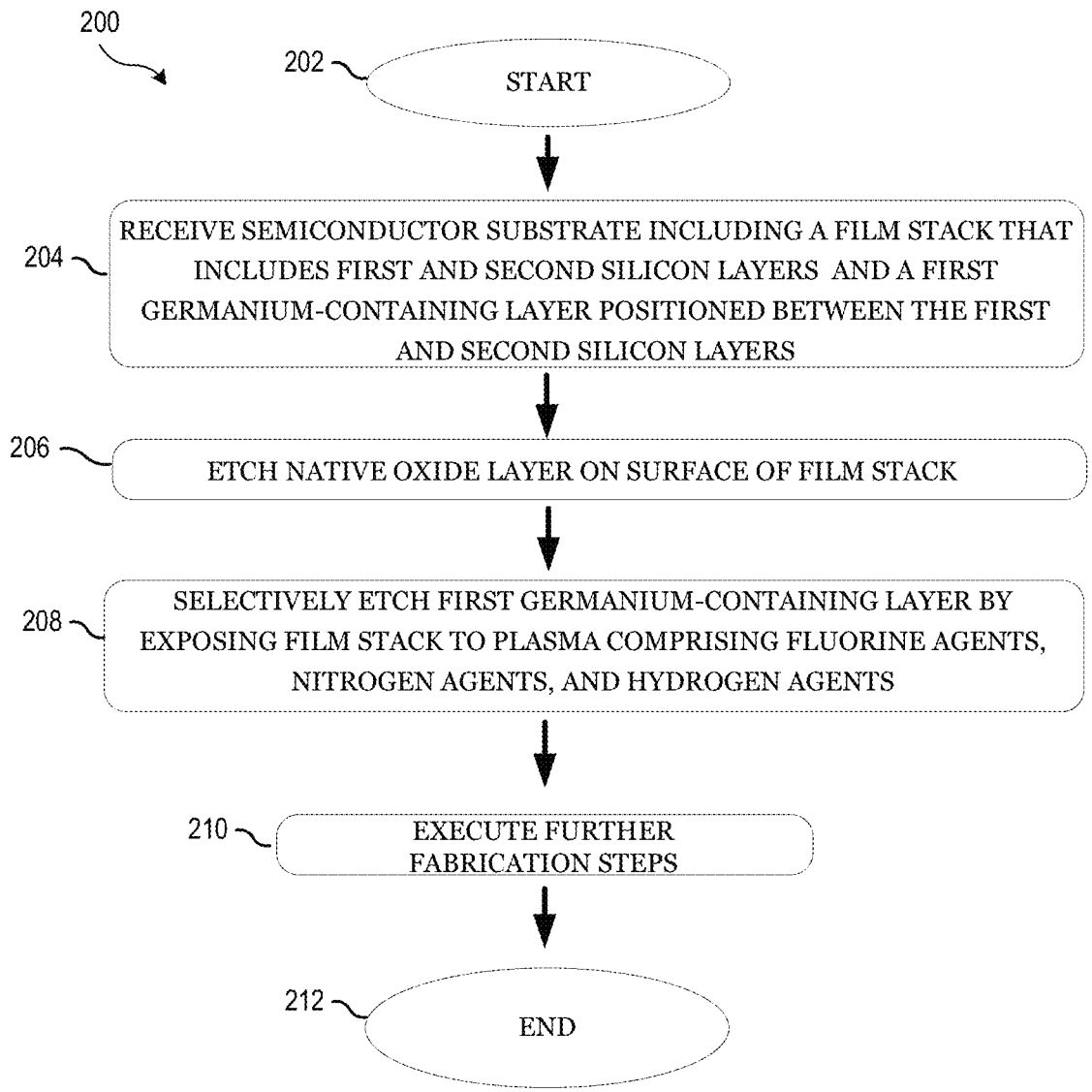
FIG. 2 illustrates an example method for processing a semiconductor substrate, according to certain embodiments of this disclosure.

FIG. 2 illustrates an example method 200 for processing substrate 102, according to certain embodiments of this disclosure. Method 200 begins at step 202. At step 204, substrate 102 is received. Substrate 102 has film stack 104 that includes Ge-containing layers 108 and Si layers 110 in an alternating stacked arrangement. That is, film stack 104 may include alternating Ge-containing layers 108 and Si layers 110 (e.g., as illustrated in FIG. 1A). Barrier layer 114 (e.g., an NOL) may be present on surfaces of film stack 104, such as on exposed surfaces 116 of Ge-containing layers 108, exposed surfaces 118 of Si layers 110, and exposed surfaces of base layer 106 and hard mask 112.

At step 206, barrier layer 114 on surfaces of film stack 104 is etched to remove barrier layer 114, from exposed surfaces 116 of Ge-containing layers 108, from exposed surfaces 118 of Si layers 110, and from exposed surfaces of base layer 106 and hard mask 112, for example. Barrier layer 114 may be removed using any suitable process (e.g., a wet etch or dry etch process).

At step 208, Ge-containing layers 108 are selectively etched by exposing substrate 102 (including film stack 104) to plasma 122. Plasma 122 may include fluorine agents 126, hydrogen agents 128, and nitrogen agents 130. Plasma 122 etches Ge-containing layers 108 and causes passivation layer 124 to be formed on exposed surfaces 118 of Si layers 110 to inhibit etching of Si layers 110 during exposure of semiconductor device 102 (including film stack 104) to plasma 122. In certain embodiments, step 208 is an isotropic etch process.

In certain embodiments, plasma 122 is generated from gases that include $NF_3$ gas, and fluorine agents 126 include fluorine disassociated from the $NF_3$ gas. In an example, nitrogen agents 130 include nitrogen disassociated from the $NF_3$ gas. In certain embodiments, plasma 122 is generated from gases that include $H_2$ gas, and hydrogen agents 128 include hydrogen. In certain embodiments, plasma 122 is generated from gases that include at least one noble gas, such as Ar, He, or Kr. As particular examples, plasma 122 may be generated from a gas combination that includes $NF_3$, $NH_3$, and Ar; $NF_3$, $NH_3$, $N_2$, and Ar; $NF_3$, $H_2$, and Ar; or $NF_3$, $H_2$, Ar, and $N_2$. In certain embodiments, passivation layer 124 formed on exposed surfaces 118 of Si layers 110 includes Si nitride (e.g., $Si_3N_4$).

Selectively etching Ge-containing layers 108 may include selectively etching end portions of Ge-containing layers 108 to form indents 136 in film stack 104 above, below, or between Si layers 110. As Ge-containing layers 108 are selectively etched, additional surfaces 138 of Si layers 110 are exposed, and plasma 122 forms passivation layer 124 on additional surfaces 138. In certain embodiments, selectively etching Ge-containing layer 108 includes selectively removing substantially all of Ge-containing layers 108 such that Si layers 110 are released.

In certain embodiments, one or more of the Ge-containing layers 108 are SiGe layers that includes about fifty percent or less Ge. In a more particular embodiment, one or more of the Ge-containing layers 108 include less than or equal to about fifteen percent Ge, and the selectivity (as measured by respective etch rates) of the one or more fifteen percent Ge-containing layers 108 to the Si layers 110 is greater than or equal to about 70:1.

At step 210, additional fabrication steps are executed. The discussion of potential additional processing steps described above with reference to FIG. 1D is incorporated by reference. For example, in certain embodiments, step 208 is integrated into a process for forming Si layers 110 into respective nanowires for a channel region of a semiconductor device, such as a GAA device. At step 212, the method ends.

Figure 3:
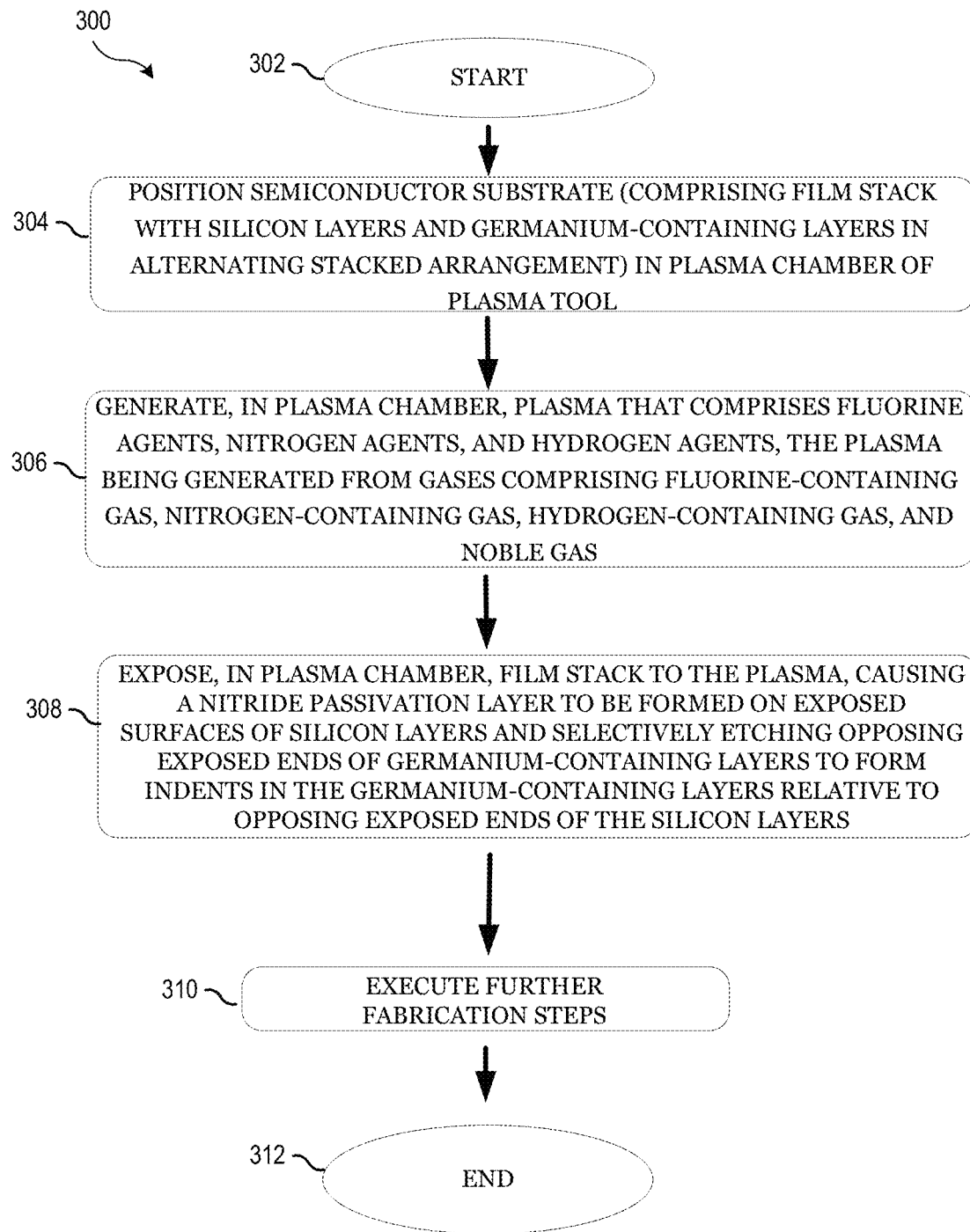
FIG. 3 illustrates an example method for processing a semiconductor substrate, according to certain embodiments of this disclosure.

FIG. 3 illustrates an example method 300 for processing substrate 102, according to certain embodiments of this disclosure. Method 300 begins at step 302. A step 304, substrate 102 is positioned in plasma chamber 123 of a plasma tool. Substrate 102 has film stack 104 that includes Ge-containing layers 108 and Si layers 110 in an alternating stacked arrangement (e.g., as shown in FIG. 1A).

At step 306, plasma 122 is generated in plasma chamber 123 of the plasma tool. Plasma 122 includes fluorine agents 126, hydrogen agents 128, and nitrogen agents 130. Plasma 122 may be generated from gases that include a fluorine-containing gas, such as $NF_3$, $SF_6$, or $CF_4$. Fluorine agents 126 may include fluorine disassociated from the fluorine-containing gas. In certain embodiments, nitrogen agents 130 include nitrogen disassociated from $NF_3$ or another suitable nitrogen containing gas that might or might not be part of a compound used to introduce the etchant (e.g., fluorine). In certain embodiments, plasma 122 is generated from gases that include a hydrogen-containing gas (e.g., $H_2$ or $NH_3$), and hydrogen agents 128 include hydrogen disassociated from the hydrogen-containing gas.

In certain embodiments, plasma 122 is generated from gases that include at least one noble gas, such as Ar, He, or Kr. As particular examples, plasma 122 may be generated from a gas combination that includes $NF_3$, $NH_3$, and Ar; $NF_3$, $NH_3$, $N_2$, and Ar; $NF_3$, $H_2$, and Ar; or $NF_3$, $H_2$, Ar, and $N_2$. In certain embodiments, passivation layer 124 formed on exposed surfaces 118 of Si layers 110 includes Si nitride (e.g., $Si_3N_4$).

At step 308, substrate 102 (including film stack 104) is exposed to plasma 122 in plasma chamber 123. Plasma 122 causes passivation layer 124, which may be a nitride layer, to be formed on exposed surfaces 118 and additional surfaces 138 of Si layers 110. In certain embodiments, passivation layer 124 includes Si nitride ($Si_3N_4$). Plasma 122 also selectively etches exposed surfaces 116 (e.g., opposing exposed ends) of Ge-containing layers 108 to form indents 136 in Ge-containing layers 108 relative to exposed surfaces 118 (e.g., opposing exposed ends) of Si layers 110. Passivation layer 124 inhibits etching of Si layers 110 by plasma 122. In certain embodiments, step 308 is an isotropic etch process.

At step 310, additional fabrication steps are executed. The discussion of potential additional processing steps described above with reference to step 210 of FIG. 2 is incorporated by reference. At step 312, the method ends.

Figure 4:
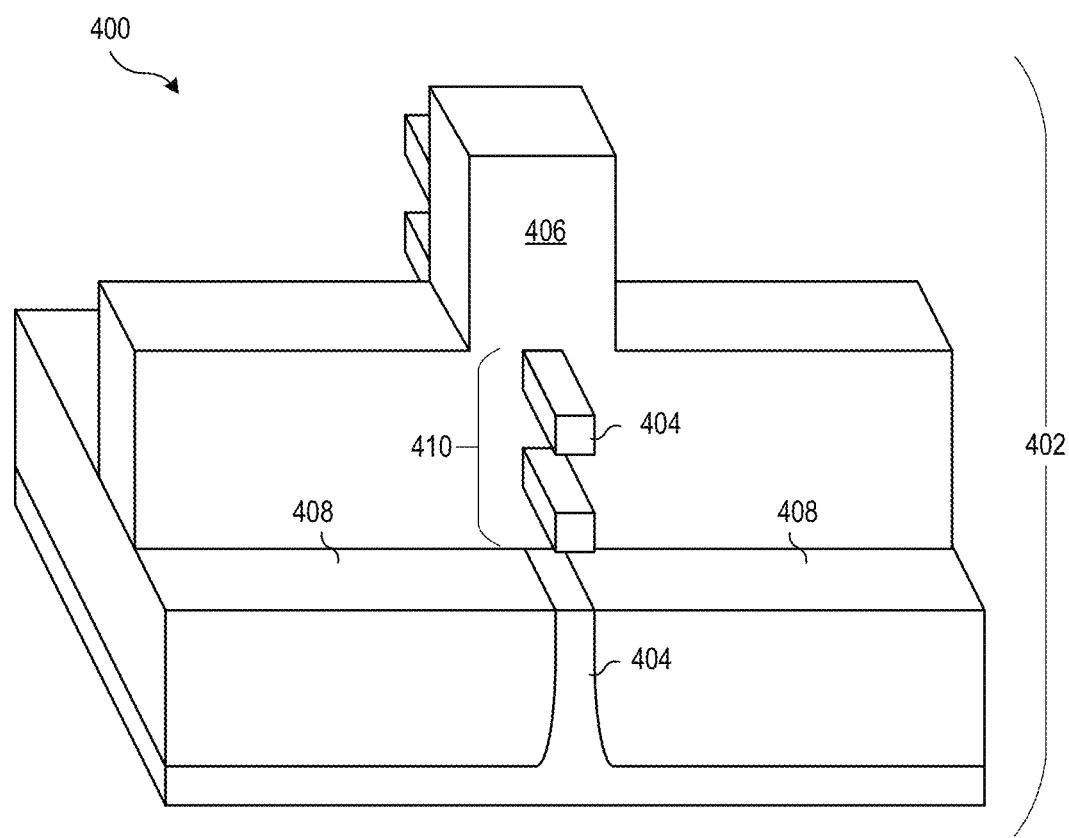
FIG. 4 illustrates an example device including a substrate with a recessed alternating film stack, according to certain embodiments of this disclosure.

FIG. 4 illustrates an example device 400 including a substrate with a recessed alternating film stack according to certain embodiments of this disclosure. At least a portion of device 400 may be formed using any of the processes and methods as described herein.

Device 400 includes a substrate 402 that includes a channel material 404 (e.g., Si or SiGe) and a gate material 406, (e.g. Ge or SiGe). Channel material 404 may correspond to Si layers 110 of substrate 102, at some point after process 100. Device 400 may be a GAA device as shown here or may be any other device, such as a fin field-effect transistor (FinFET). Device 400 also may include isolation regions 408. In certain embodiments, isolation regions 408 are shallow trench isolations (STIs).

Device 400 may be fabricated by first forming a recessed alternating film stack 410 (which may correspond to film stack 104 following process 100, possibly with additional subsequent processes) and then depositing additional gate material 406 over recessed alternating film stack 410. Specifically, device 400 may be formed by heteroepitaxial growth of alternating Si and Ge or SiGe layers which are then patterned and recessed vertically to expose the Si layers laterally.

The application of embodiments described herein may advantageously be an optimal solution for the 5 nm node, 3 nm node, or lower. For example, the GAA device architecture may be suitable for scaling beyond the 7 nm node. The GAA device architecture may address short channel effects found in some FinFET architectures by wrapping the gate around the entire channel instead of only three sides. This could reduce or eliminate current leakage occurring under the gate of the FinFET, therefore reducing non-active power losses.

Figure 5:
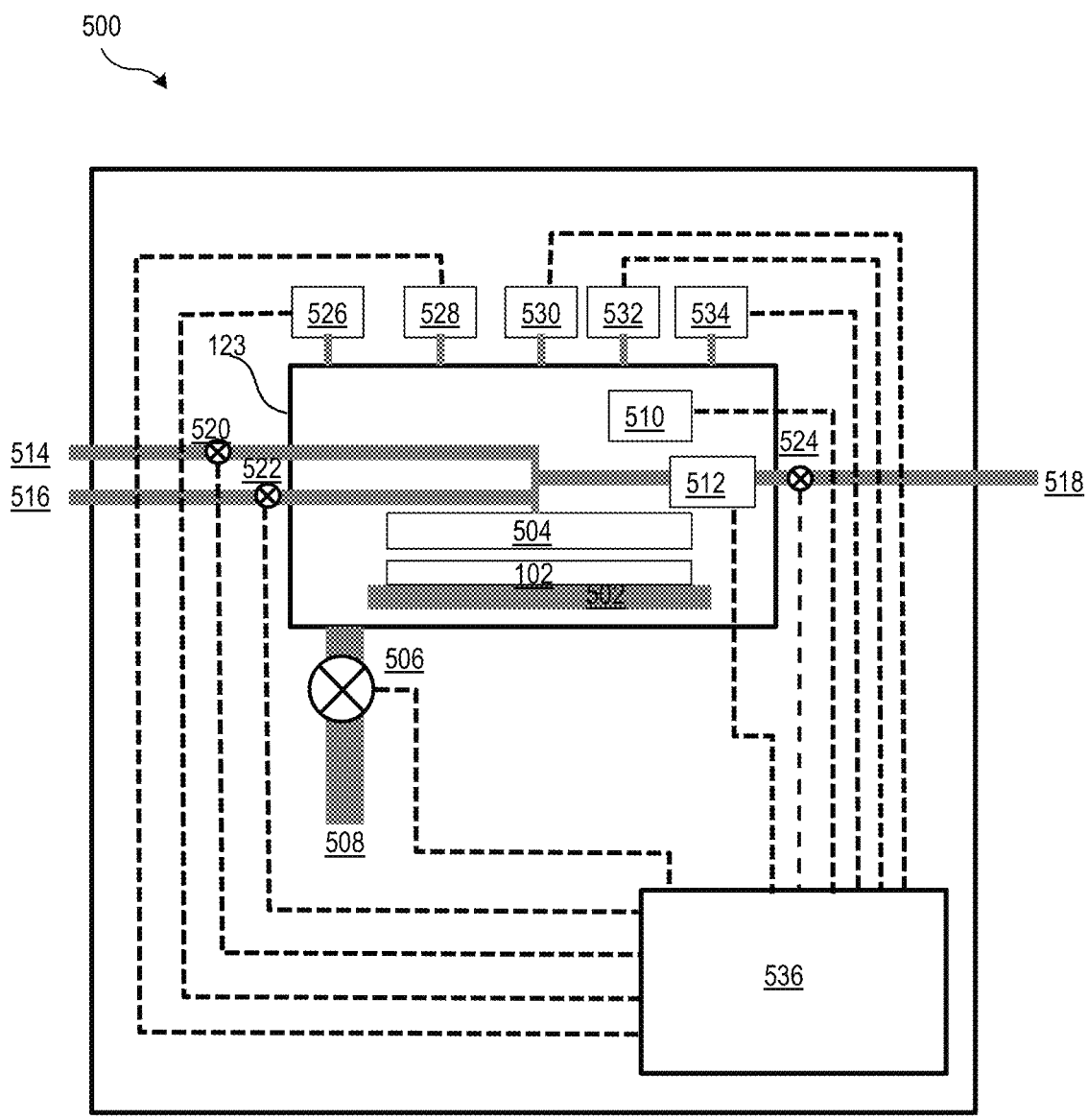
FIG. 5 illustrates a block diagram of an example plasma tool, according to certain embodiments of this disclosure.

FIG. 5 illustrates a block diagram of an example plasma tool 500, according to certain embodiments of this disclosure. Although a particular plasma tool 500 is illustrated and described, any suitable type of plasma tool may be used. Plasma tool 500 may be used to execute plasma step 120 described with respect to FIGS. 1A-1D and 2-4.

Plasma tool 500 includes plasma chamber 123 in which a semiconductor substrate (e.g., substrate 102) is processed using a plasma (e.g., plasma 122). Plasma chamber 123 includes a substrate table 502 configured to support substrate 102 during processing. In certain embodiments, substrate 102 is positioned on substrate table 502 in the condition shown in FIG. 1B, following removal of barrier layer 114 for example, for performing plasma step 120 using plasma 122. The material of Ge-containing layers 108 (described above, for example, with reference to FIGS. 1A-1D) of film stack 104 of substrate 102 is selectively etched within plasma chamber 123 by injecting the plasma (e.g., plasma 122) through a shower head 504 of plasma tool 500. Shower head 504 may include a single mixed reaction cavity that is filled with the precursor gases, mixing gases, and carrier gases that mix to form plasma 122 and a set of exit holes for dispensing plasma 122 toward substrate 102.

Plasma chamber 123 includes and/or is otherwise coupled to a vacuum pump 5o6 coupled to a vacuum line 5o8 to purge residual precursor gases from plasma chamber 123 and also may include and/or otherwise be coupled to a pressure system to maintain a target pressure in certain embodiments. Plasma chamber 123 may further include machine tools such as a heater 510 and temperature sensor 512 used to heat substrate 102 and control the temperature within plasma chamber 123 and/or of substrate 102.

Plasma tool 500 includes a precursor gas line 514, a mixture gas line 516, and a carrier gas line 518 coupled to shower head 504. In certain embodiments, the precursor gas fed through precursor gas line 514 may include a fluorine-based precursor, such as $NF_3$ and/or $SF_6$, the mixture gas fed through mixture gas line 516 may include hydrogen (e.g., $H_2$ or $NH_3$), and the carrier gas fed through carrier gas line 518 may include a noble gas, such as Ar, He, or Kr.

In certain embodiments, plasma tool 500 may include a system of mass flow controllers and sensors for control of gas flow (e.g., mass flow rate). Accordingly, plasma tool 500 may include a first flow controller 520, a second flow controller 522, a third flow controller 524, vacuum pump 506, heater 510, temperature sensor 512, voltage-current (V-I) sensor 526, and substrate sensors 528, 530, 532, and 534 (528-534). Precursor gas line 514, mixture gas line 516, and carrier gas line 518 are coupled to and controlled by first flow controller 520, second flow controller 522, and third flow controller 524, respectively.

Plasma tool 500 may include a controller 536 to control aspects of plasma step 120. Controller 536 may be implemented in any suitable manner. For example, controller 536 may be a computer. As another example, controller 536 may include one or more programmable ICs programmed to provide functionality described herein. In a particular example, one or more processors (e.g., microprocessor, microcontroller, central processing unit, etc.), programmable logic devices (e.g., complex programmable logic device), field programmable gate array, etc.), and/or other programmable ICs are programmed with software or other programming instructions to implement functionality described herein for controller 536. The software or other programming instructions can be stored in one or more non-transitory computer-readable mediums (e.g., memory storage devices, flash memory, dynamic random access memory, reprogrammable storage devices, hard drives, floppy disks, DVDs, CD-ROMs, etc.), and the software or other programming instructions when executed by the programmable ICs cause the programmable ICs to perform operations described herein.

Machine components such as heater 510 and temperature sensor 512 of plasma chamber 123 as well as flow controllers 520, 522, and 524, vacuum pump 506, and other components external to plasma chamber 123 are coupled to and controlled by controller 536.

Equipment sensors measure equipment parameters such as the temperature of substrate table 502, heater currents, vacuum pump speed and temperature, and provide signals to ensure the equipment is operating properly. Various process sensors measure process parameters such as process temperature, process pressure, plasma density, gas flow rates, and gas composition, and provide signals to ensure the process is operating properly. The data from the equipment and process sensors provide feedback to controller 536 continuously throughout plasma step 120. Controller 536 can make adjustments in real time to keep the equipment and process close to center of specifications.

Controller 536 receives data from the sensor(s) and controls process parameters of plasma chamber 123 based on the sensor data. Controller 536 may analyze the data collected by the sensor(s), determine when to modify or end one or more steps of plasma step 120, and provide feedback to control process parameters of components of plasma chamber 123.

Controller 536 may be connected to V-I sensor 526, and substrate sensors 528-534 to monitor plasma 122 as substrate 102 is exposed to plasma 122 to provide conditions of plasma 122 as well as optionally composition and thickness data in real time. This feedback data can be used by controller 536 to continuously adjust plasma step 120 as substrate 102 is selectively etched using plasma 122 and, for example, to turn off plasma step 120 when the target indent (e.g., etched width 144) is reached.

Specifically, measurement data from substrate sensors 528-534, and temperature sensor 512 may be received by controller 536 while controller 536 generates control signals sent to first flow controller 520, second flow controller 522, third flow controller 524, vacuum pump 5o6, and heater 510.

Controller 536 may receive measurement or metrology data from substrate sensors 528-534 taken at multiple points across substrate 102 to measure process uniformity and the thickness and composition of passivation layer 124 (formed from exposure of substrate 102 to plasma 122), exposed end separation 142, and/or the target indent (e.g., etch width 144) in situ and in real time. For example, multiple across substrate sensors in a multi-substrate plasma tool can be used to monitor and tune the thickness and composition of passivation layer 124 (formed from exposure of substrate 102 to plasma 122), exposed end separation 142, and/or the target indent (e.g., etch width 144) from the top to the bottom of the substrate 102. Multiple across substrate sensors in a single substrate plasma tool can be used to monitor and tune the thickness and composition of passivation layer 124 (formed from exposure of substrate 102 to plasma 122), exposed end separation 142, and/or the target indent (e.g., etch width 144) from the center of the substrate 102 to the edge of the substrate 102.

Substrate sensors 528-534 may be coupled to and/or located within plasma chamber 123 for monitoring various parameters of substrate 102, plasma tool 500 and/or plasma step 120. Substrate sensors 528-534 may include various types of sensors including, but not limited to, optical sensors (such as cameras, lasers, light, reflectometer, spectrometers, ellipsometric, etc.), capacitive sensors, ultrasonic sensors, gas sensors, or other sensors that may monitor a condition of substrate 102, plasma 122, and/or plasma tool 500. In certain embodiments, one or more optical sensors may be used to measure in real time (during plasma step 120) the thickness and refractive index of the material at surfaces 118 of Si layers 110 and surfaces of base layer 106 (e.g., where passivation layer 124 is being formed), exposed end separation 142, and/or an etched width 144a (or another suitable measurement). As another example, a spectrometer may be used to measure in real time (during plasma step 120) a film thickness of the material at surfaces 118 of Si layers 110 and surfaces of base layer 106 (e.g., where passivation layer 124 is being formed), exposed end separation 142, and/or an etched width 144a (or another suitable measurement). In yet another embodiment, a residual gas analyzer (RGA) may be used to detect in real time (during plasma step 120) precursor breakdown for real-time chemical reaction completion detection.

Controller 536 may receive user-input process parameters, including, for example, etch rate, conformality, profile, and deposition rate (e.g., of passivation layer 124) based on standard plasma etch parameters such as chamber pressure, chamber temperature, RF source power, RF bias power, RF waveform (e.g., continuous wave RF, pulsed RF, square pulse, sawtooth pulse, and the like), etch time, and the composition and flow rates of various process and carrier gases. Advantageously, allowing a user to tune plasma 122 to meet a target local critical dimension uniformity (LCDU).

Based on data from substrate sensors 528-534 and the user inputted process parameters, controller 536 generates control signals to temperature sensor 512 and heater 510 to adjust the heat within plasma chamber 123. As heater 510 heats plasma chamber 123, controller 536 constantly or periodically monitors temperature sensor 512 to track the temperature of plasma chamber 123 to send control signals to heater 510 to maintain the temperature in plasma chamber 123.

Once controller 536 determines, based on data provided by temperature sensor 512, that the target temperature of plasma chamber 123 has been reached, controller 536 generates control signals and data signals to activate first flow controller 520, second flow controller 522, and third flow controller 524 and provide, based on the user-input process parameters, target flow rates of the precursor gas to first flow controller 520, a target flow rate of the mixing gas to second flow controller 522, and a target flow rate of the carrier gas to third flow controller 524. Once controller 536 determines that the corresponding flow rates are established, controller 536 provides power to plasma chamber 123 to power plasma 122 through bias and source electrodes. Based on the measurements from V-I sensor 526, the power being supplied to the bias and source electrodes may be adjusted. First flow controller 520, second flow controller 522, and third flow controller 524 each may be a closed loop control system connected to a flow rate sensor and an adjustable proportional valve that allows each flow controller to constantly or periodically monitor and internally maintain the target flow rates of each gas via the flow rate sensor and the adjustable proportional valve.

In certain embodiments, once controller 536 determines, based on the user inputted data, that the etch process time has been met, controller 536 generates control signals to deactivate first flow controller 520, second flow controller 522, and third flow controller 524, which may be deactivated at the same or different times, as may be appropriate.

Controller 536 may use or analyze substrate sensor data to determine when to end plasma step 120. For example, controller 536 may receive data from a residual gas analyzer to detect an endpoint of plasma step 120. In another example, controller 536 may use spectroscopic ellipsometry to detect an average film thickness of passivation layer 124, exposed ends 141 of Si layers 110, and/or exposed end separation 142 during plasma step 120 and indicate changes during plasma step 120. In another example, controller 536 may use spectroscopic ellipsometry to detect the refractive index of the material at surfaces 118 of Si layers 110 and surfaces of base layer 106 (e.g., where passivation layer 124 is being formed) during plasma step 120 and indicate film composition change during plasma step 120. Controller 536 may automatically end plasma step 120 when an exposed end separation 142 and/or an etched width 144a (or another suitable measurement) objective is achieved. In certain embodiments, controller 536 may automatically adjust one or more parameters such as the ratio of $NF_3$ to $H_2$ (or $NH_3$) and/or the ratio of $NF_3$ to Ar, for example, during plasma step 120 to achieve the desired etch profile of film stack 104. Controller 536 and the data from substrate sensors 528-534 also may be used to achieve a desired semiconductor substrate throughput objective. Further, controller 536 and the data from substrate sensors 528-534 may be used to achieve a desired etch profile of film stack 104 and composition along with a desired semiconductor substrate throughput or alternatively target a combination.

Although described for a particular application of forming nanowires/nanosheets for GAA devices, this disclosure may be used in any type of isotropic etch of Si that is selective to Ge-containing layers. Furthermore, although the etch being performed is primarily described as being for forming indents in film stack 104 by removing portions of opposing ends of Ge-containing layers 108, processes 100 and 400 may be used to remove substantially all portions of Ge-containing layers 108, which may be referred to as releasing Si layers 110.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for processing a semiconductor substrate, the method comprising:
   receiving a semiconductor substrate that comprises a film stack, the film stack comprising a first silicon layer, a second silicon layer, and a first germanium-containing layer positioned between the first silicon layer and the second silicon layer; and
   selectively etching the first germanium-containing layer by exposing the film stack to a plasma comprising fluorine agents, nitrogen agents, and hydrogen agents, the plasma etching the first germanium-containing layer while simultaneously causing a passivation layer to be formed on exposed surfaces of the first silicon layer and the second silicon layer to inhibit etching of the first silicon layer and the second silicon layer during exposure of the film stack to the plasma, the passivation layer comprising nitride.

2. The method of claim 1, wherein the plasma is generated from gases comprising a noble gas.

3. The method of claim 1, wherein the plasma is generated from gases comprising nitrogen trifluoride ($NF_3$) gas, the fluorine agents comprising fluorine disassociated from the $NF_3$ gas.

4. The method of claim 1, wherein the plasma is generated from gases comprising $H_2$ gas, the hydrogen agents being hydrogen.

5. The method of claim 1, wherein the plasma is generated from a gas combination comprising:
   nitrogen trifluoride ($NF_3$), ammonia ($NH_3$), and argon (Ar);
   $NF_3$, $NH_3$, nitrogen ($N_2$), and Ar;
   $NF_3$, hydrogen ($H_2$), and Ar; or
   $NF_3$, $H_2$, Ar, and $N_2$.

6. The method of claim 1, wherein the passivation layer formed on the exposed surfaces of the first silicon layer and the second silicon layer comprises silicon nitride.

7. The method of claim 1, wherein the first germanium-containing layer is a silicon-germanium (SiGe) layer that comprises about fifty percent or less germanium.

8. The method of claim 7, wherein:
   the first germanium-containing layer comprises less than or equal to about fifteen percent germanium; and
   selectivity of the first germanium-containing layer to the first and second silicon layers is greater than or equal to about 70:1.

9. The method of claim 1, wherein selectively etching the first germanium-containing layer comprises selectively etching an end portion of the first germanium-containing layer to form an indent in the film stack between the first silicon layer and the second silicon layer.

10. The method of claim 1, wherein, as the first germanium-containing layer is selectively etched, additional surfaces of the first silicon layer and the second silicon layer are exposed, the plasma forming the passivation layer on the additional surfaces.

11. The method of claim 1, wherein selectively etching the first germanium-containing layer comprises selectively removing substantially all of the first germanium-containing layer between the first silicon layer and the second silicon layer.

12. The method of claim 1, wherein, prior to selectively etching the first germanium-containing layer:
   a native oxide layer is present on a surface of the film stack; and
   the method further comprises etching the native oxide layer.

13. The method of claim 1, wherein:
   the film stack further comprises a second germanium-containing layer and a third silicon layer, the second germanium-containing layer positioned between the second silicon layer and the third silicon layer; and
   the method comprises selectively etching the second germanium-containing layer by exposing the film stack to the plasma, the plasma forming the passivation layer on exposed surfaces of the third silicon layer to inhibit etching of the third silicon layer during exposure of the film stack to the plasma.

14. A method for processing a semiconductor substrate, the method comprising:
   positioning a semiconductor substrate in a plasma chamber of a plasma tool, the semiconductor substrate comprising a film stack that comprises silicon layers and germanium-containing layers in an alternating stacked arrangement, with at least two silicon layers and at least two germanium-containing layers;
   generating, in the plasma chamber of the plasma tool, a plasma that comprises fluorine agents, nitrogen agents, and hydrogen agents, the plasma being generated from gases comprising a fluorine-containing gas, a nitrogen-containing gas, a hydrogen-containing gas, and a noble gas; and exposing, in the plasma chamber of the plasma tool, the film stack to the plasma, the plasma causing a nitride passivation layer to be formed on exposed surfaces of the silicon layers and selectively etching opposing exposed ends of the germanium-containing layers to form indents in the germanium-containing layers relative to opposing exposed ends of the silicon layers, the nitride passivation layer inhibiting etching of the silicon layers by the plasma.

15. The method of claim 14, wherein:
the fluorine-containing gas comprises nitrogen trifluoride ($NF_3$), sulfur hexafluoride ($SF_6$), or carbon tetrafluoride ($CF_4$); and
the fluorine agents comprise fluorine disassociated from the fluorine-containing gas.

16. The method of claim 14, wherein:
the hydrogen-containing gas comprises $H_2$ or ammonia ($NH_3$); and
the hydrogen agents comprise hydrogen disassociated from the hydrogen-containing gas.

17. The method of claim 14, wherein:
the nitrogen-containing gas comprises $N_2$, nitrogen trifluoride ($NF_3$) or ammonia ($NH_3$); and
the nitrogen agents comprise nitrogen disassociated from the nitrogen-containing gas.

18. The method of claim 14, wherein:
the nitrogen-containing gas and the fluorine-containing gas are part of a same gas compound; or
the nitrogen-containing gas and the hydrogen-containing gas are part of a same gas compound.

19. The method of claim 14, wherein:
a flow rate of the noble gas is greater than a flow rate of the fluorine-containing gas; and
the flow rate of the fluorine-containing gas is greater than a flow rate of the hydrogen-containing gas.

20. The method of claim 14, wherein the noble gas is argon (Ar).

21. The method of claim 14, wherein the gases from which the plasma is generated comprise:
nitrogen trifluoride ($NF_3$), ammonia ($NH_3$), and argon (Ar);
$NF_3$, $NH_3$, nitrogen ($N_2$), and Ar;
$NF_3$, hydrogen ($H_2$), and Ar; or
$NF_3$, $H_2$, Ar, and $N_2$.

22. The method of claim 14, wherein the nitride passivation layer formed on the exposed surfaces of the silicon layers comprises silicon nitride.

23. A method for processing a semiconductor substrate, the method comprising:
positioning a semiconductor substrate in a plasma chamber of a plasma tool, the semiconductor substrate comprising a film stack that comprises first layers of a first material and second layers of a second material in an alternating stacked arrangement, the first material being a germanium-containing material that includes germanium at a concentration of about ten to about fifty percent;
generating a plasma for selectively etching the first layers of the first material, generating the plasma comprising introducing gases including fluorine, nitrogen, hydrogen, and a noble gas into the plasma chamber and maintaining a pressure in the plasma chamber of less than about 50 millitorr; and
exposing, in the plasma chamber, the film stack to the plasma for a time period, the plasma causing a nitride passivation layer to be formed on exposed surfaces of the second layers of the second material and selectively etching opposing exposed ends of the first layers of the first material to form indents in the first layers of the first material relative to opposing exposed ends of the second layers of the second material.

24. A method for processing a semiconductor substrate, the method comprising:
receiving a semiconductor substrate that comprises a film stack, the film stack comprising a first silicon layer, a second silicon layer, and a first germanium-containing layer positioned between the first silicon layer and the second silicon layer; and
selectively etching the first germanium-containing layer by exposing the film stack to a plasma comprising fluorine agents, nitrogen agents, and hydrogen agents, the plasma etching the first germanium-containing layer while simultaneously causing a passivation layer to be formed on exposed surfaces of the first silicon layer and the second silicon layer to inhibit etching of the first silicon layer and the second silicon layer during exposure of the film stack to the plasma, wherein gases for generating the plasma are free of oxygen.

* * * * *